(12) United States Patent  
Jones et al.

(10) Patent No.: US 8,193,802 B2
(45) Date of Patent: Jun. 5, 2012

(54) SLIDABLY ATTACHABLE NON-CONTACT VOLTAGE DETECTOR

(75) Inventors: Mike N. Jones, Lake Forest Park, WA (US); Evans H. Nguyen, Renton, WA (US); Scott D. Bublitz, Hartland, WI (US); Jason R. Crowe, Milwaukee, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 534 days.

(21) Appl. No.: 12/421,187

(22) Filed: Apr. 9, 2009

(65) Prior Publication Data

US 2009/0257222 A1   Oct. 15, 2009

Related U.S. Application Data

(60) Provisional application No. 61/095,048, filed on Sep. 8, 2008, provisional application No. 61/043,544, filed on Apr. 9, 2008.

(51) Int. Cl.
*G01R 31/02* (2006.01)
(52) U.S. Cl. ...................................... 324/72.5
(58) Field of Classification Search ............. 324/72.5
See application file for complete search history.

(56) References Cited

U.S. PATENT DOCUMENTS

| | | | |
|---|---|---|---|
| 1,152,632 A | 9/1915 | Hogan, Jr. | |
| 1,799,683 A | 4/1931 | Geiger | |
| 1,836,934 A | 12/1931 | Morecroft | |
| 1,895,812 A | 1/1933 | Morecroft | |
| 2,536,577 A | 1/1951 | Simmons et al. | |
| 3,309,690 A | 3/1967 | Moffitt | |
| 3,482,235 A | 12/1969 | Johnson | |
| 3,650,153 A | 3/1972 | Schwab | |
| 3,775,682 A | 11/1973 | Ross | |
| 3,786,468 A | 1/1974 | Moffitt | |
| 3,806,803 A | 4/1974 | Hall | |
| 3,826,981 A | 7/1974 | Ross | |
| 3,828,256 A | 8/1974 | Liu | |
| 3,899,735 A | 8/1975 | Singer | |

(Continued)

FOREIGN PATENT DOCUMENTS

CN   1595176   3/2005

(Continued)

OTHER PUBLICATIONS

Digital Multimeter (Tools of the Trade)—24×7, Encyclopedia.com, Available Online at: <http://www.encyclopedia.com/doc/1G1-165939474.html>, 2 pages, Dec. 1, 2006.

(Continued)

*Primary Examiner* — Jeff Natalini
(74) *Attorney, Agent, or Firm* — Michael Best & Friedrich LLP

(57) ABSTRACT

The invention provides a non-contact voltage detector ("NCVD") that includes a housing, a power switch, and an LED flashlight. The housing includes an upper portion and a lower portion which are slidably attachable to one another. A voltage sense circuit is positioned within the housing and illuminates a voltage sense indicator when it detects an AC voltage. The power switch is operable to activate the voltage sense circuit and the LED flashlight. The NCVD includes a first set of rails and a second set of rails for slidably attaching the NCVD to a test and measurement device, such as a digital multimeter ("DMM") or an infrared ("IR") temperature gun.

16 Claims, 14 Drawing Sheets

U.S. PATENT DOCUMENTS

| | | | |
|---|---|---|---|
| 3,919,631 | A | 11/1975 | Brown |
| 3,944,921 | A | 3/1976 | Tsuda et al. |
| 4,027,236 | A | 5/1977 | Stewart |
| 4,041,380 | A | 8/1977 | Epstein |
| 4,152,639 | A | 5/1979 | Chaffee |
| 4,238,728 | A | 12/1980 | Wells, Jr. et al. |
| 4,298,837 | A | 11/1981 | Koslar |
| 4,349,783 | A | 9/1982 | Robson et al. |
| 4,464,622 | A | 8/1984 | Franklin |
| 4,504,781 | A | 3/1985 | Hargrove |
| 4,527,118 | A | 7/1985 | Koslar |
| 4,612,538 | A | 9/1986 | Karcher, Jr. |
| 4,716,371 | A | 12/1987 | Blitshteyn et al. |
| 4,724,382 | A | 2/1988 | Schauerte |
| 4,724,393 | A | 2/1988 | Kumada et al. |
| 4,791,376 | A | 12/1988 | Freedman et al. |
| D299,318 | S | 1/1989 | Chiang |
| 4,797,620 | A | 1/1989 | Williams |
| 4,804,908 | A | 2/1989 | Mitchell |
| 4,804,922 | A | 2/1989 | Sometani et al. |
| 4,818,945 | A | 4/1989 | Bossard |
| 4,853,617 | A | 8/1989 | Douglas et al. |
| 4,853,639 | A | 8/1989 | Vosteen et al. |
| 4,859,931 | A | 8/1989 | Yamashita et al. |
| 4,859,932 | A | 8/1989 | Whitley |
| 4,983,954 | A | 1/1991 | Huston |
| 4,992,741 | A | 2/1991 | Douglas et al. |
| 4,998,058 | A | 3/1991 | Tofte et al. |
| 5,103,165 | A | 4/1992 | Sirattz |
| 5,250,893 | A | 10/1993 | Gambill et al. |
| RE34,507 | E | 1/1994 | Egawa et al. |
| 5,285,163 | A | 2/1994 | Liotta |
| 5,293,113 | A | 3/1994 | Beha et al. |
| 5,315,255 | A | 5/1994 | Bettinger |
| 5,325,047 | A | 6/1994 | Kempton |
| 5,352,974 | A | 10/1994 | Heger |
| 5,363,045 | A | 11/1994 | Martin et al. |
| 5,414,344 | A | 5/1995 | Chinn |
| 5,414,345 | A | 5/1995 | Rogers |
| 5,457,394 | A | 10/1995 | McEwan |
| 5,460,451 | A | 10/1995 | Wadman |
| 5,473,244 | A | 12/1995 | Libove et al. |
| 5,477,133 | A | 12/1995 | Earle |
| 5,512,834 | A | 4/1996 | McEwan |
| 5,619,128 | A | 4/1997 | Heger |
| 5,640,155 | A | 6/1997 | Springer |
| 5,672,964 | A | 9/1997 | Vinci |
| 5,703,928 | A | 12/1997 | Galloway et al. |
| 5,812,057 | A | 9/1998 | Hepworth et al. |
| 5,834,939 | A | 11/1998 | Makhija |
| 5,867,019 | A | 2/1999 | Malenko et al. |
| 5,877,618 | A | 3/1999 | Luebke et al. |
| 5,949,230 | A | 9/1999 | Kobayashi et al. |
| 5,952,820 | A | 9/1999 | Thrasher et al. |
| 6,020,822 | A | 2/2000 | Marshall |
| 6,023,159 | A | 2/2000 | Heger |
| 6,043,640 | A | 3/2000 | Lauby et al. |
| 6,043,641 | A | 3/2000 | Singer et al. |
| 6,050,722 | A | 4/2000 | Thundat et al. |
| 6,095,682 | A | 8/2000 | Hollander et al. |
| 6,100,679 | A | 8/2000 | McCasland |
| 6,137,285 | A | 10/2000 | Walsten et al. |
| 6,154,710 | A | 11/2000 | Kobayashi et al. |
| 6,198,271 | B1 | 3/2001 | Heger et al. |
| 6,211,662 | B1 | 4/2001 | Bijawat et al. |
| 6,242,903 | B1 | 6/2001 | Klingberg et al. |
| 6,329,924 | B1 | 12/2001 | McNulty |
| 6,377,054 | B1 | 4/2002 | Beha |
| 6,424,139 | B2 | 7/2002 | Bystrom et al. |
| 6,433,530 | B1 | 8/2002 | Pool |
| 6,466,029 | B2 * | 10/2002 | Stroth et al. .......... 324/509 |
| 6,470,283 | B1 | 10/2002 | Edel |
| 6,644,825 | B2 | 11/2003 | Lin |
| 6,731,102 | B2 | 5/2004 | Gregorec, Jr. et al. |
| 6,731,218 | B2 | 5/2004 | Luebke et al. |
| 6,734,658 | B1 | 5/2004 | Bierer |
| 6,812,685 | B2 | 11/2004 | Steber et al. |
| 6,828,767 | B2 | 12/2004 | Douglas |
| 6,844,819 | B2 | 1/2005 | Luebke et al. |
| 6,848,139 | B2 | 2/2005 | Simon et al. |
| 6,894,508 | B2 | 5/2005 | Sanoner et al. |
| 6,924,605 | B2 | 8/2005 | Chun |
| 6,951,409 | B2 | 10/2005 | Hsien |
| 6,998,832 | B1 | 2/2006 | McNulty |
| 7,030,599 | B2 | 4/2006 | Douglas |
| 7,135,975 | B2 | 11/2006 | Hoshina et al. |
| 7,170,076 | B2 | 1/2007 | Butler et al. |
| 7,176,656 | B2 | 2/2007 | Feldmann |
| 7,192,186 | B2 | 3/2007 | Blakeley, III |
| 7,193,405 | B2 | 3/2007 | Murray |
| 7,208,932 | B1 | 4/2007 | Chun |
| 7,242,173 | B2 | 7/2007 | Cavoretto |
| 7,295,130 | B2 | 11/2007 | Luebke et al. |
| 7,327,133 | B2 | 2/2008 | Baker et al. |
| 7,336,063 | B1 | 2/2008 | Bierer |
| 7,407,323 | B2 | 8/2008 | Hutcherson |
| 7,468,674 | B2 | 12/2008 | Onachilla et al. |
| 7,504,817 | B2 | 3/2009 | Sanower et al. |
| 2001/0007420 | A1 | 7/2001 | Bijawat et al. |
| 2001/0024366 | A1 | 9/2001 | Chen |
| 2006/0090333 | A1 | 5/2006 | Cahill et al. |
| 2006/0202682 | A1 | 9/2006 | Mednikov et al. |
| 2006/0262829 | A1 | 11/2006 | Manlove et al. |
| 2007/0079445 | A1 | 4/2007 | Siebeck |
| 2007/0297866 | A1 | 12/2007 | Bassett |
| 2008/0042657 | A1 | 2/2008 | Radle et al. |
| 2008/0186010 | A1 | 8/2008 | Skultety-Betz et al. |
| 2008/0196910 | A1 * | 8/2008 | Radle et al. .......... 173/2 |
| 2008/0235954 | A1 | 10/2008 | Radle |

FOREIGN PATENT DOCUMENTS

| | | |
|---|---|---|
| DE | 4020382 | 2/1991 |
| JP | 6242154 | 9/1994 |
| JP | 11295355 | 10/1999 |
| WO | 86/04424 | 7/1986 |
| WO | 2008/011517 | 1/2008 |

OTHER PUBLICATIONS

Buildingtalk, News from Extech Instruments, "Extech Extended Family of Digital Multimeters", Available Online at: <http://www.buildingtalk.com/news/exi/exi102.html>, 6 pages, edited by the Buildingtalk editorial team Sep. 15, 2006.

Electrical Products and Solutions, EPSMag.net, Available Online at: <http://www.epsmag.net/articles/2005111/productfocus.asp>, 8 pages, dated Nov. 13, 2005.

Extech Instruments, User's Guide: Model DVA30—AC Voltage and Current Detector, Extech Instruments Corporation, 4 pages, 2002.

Landis, Floyd, II, et al.; "Industry Applications Society 42nd Annual Petroleum and Chemical Industry Conference", The Institute of Electrical and Electronics Engineers, Record of Conference Papers, Denver, Colorado, Sep. 11-13, 1995.

Extech Instruments, New Products Fall 2004 Catalog, www.extech.com/export, Extech Instruments Corporation, 2004.

User's Guide Extech Instruments A Flir Company. Mini Multimeter with Non-Contact Voltage Detector (NCV), Model EX320. pp. 1-14. Copyright 2007 Extech Instruments Corporation.

User's Guide Extech Instruments. Mini Multimeter with Non-Contact Voltage Detector (NCV), Model EX310. pp. 1-16. Copyright 2005 Extech Instruments Corporation.

* cited by examiner

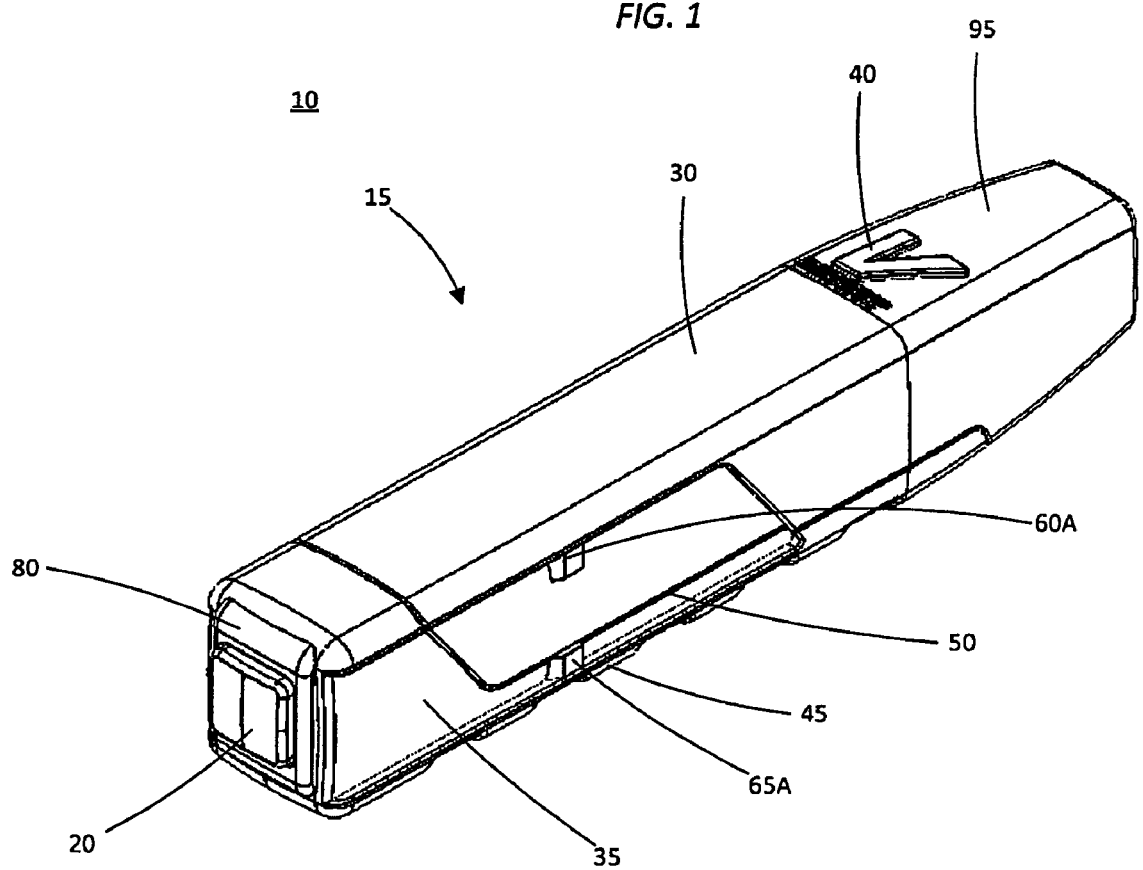

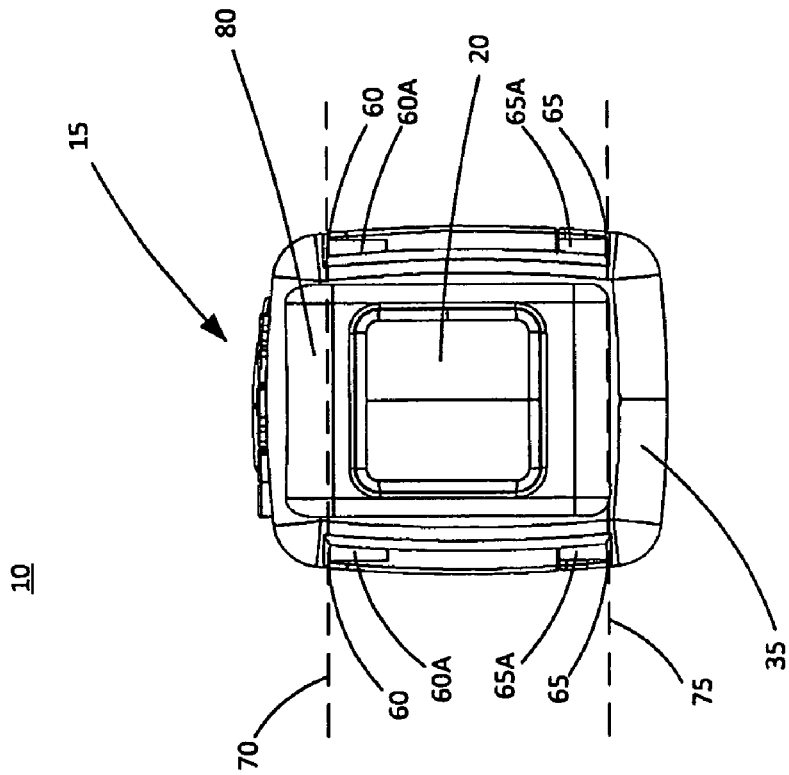
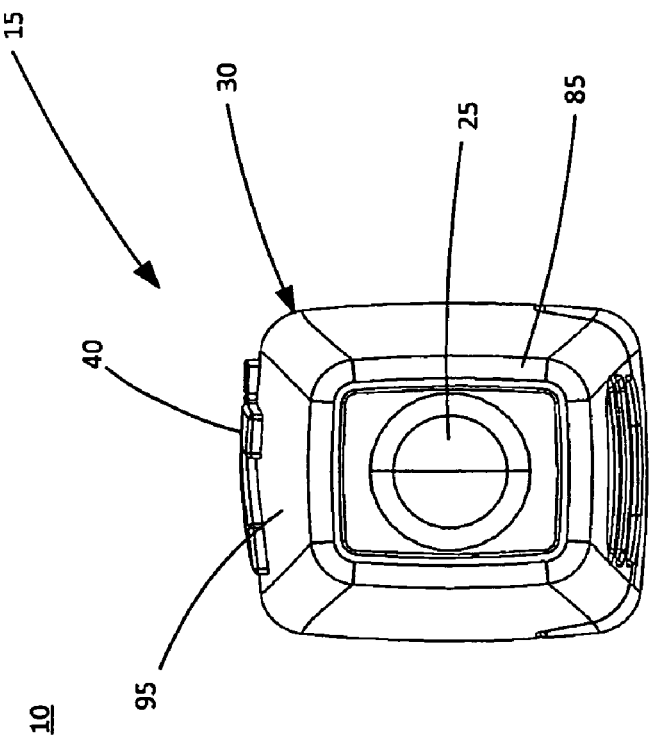

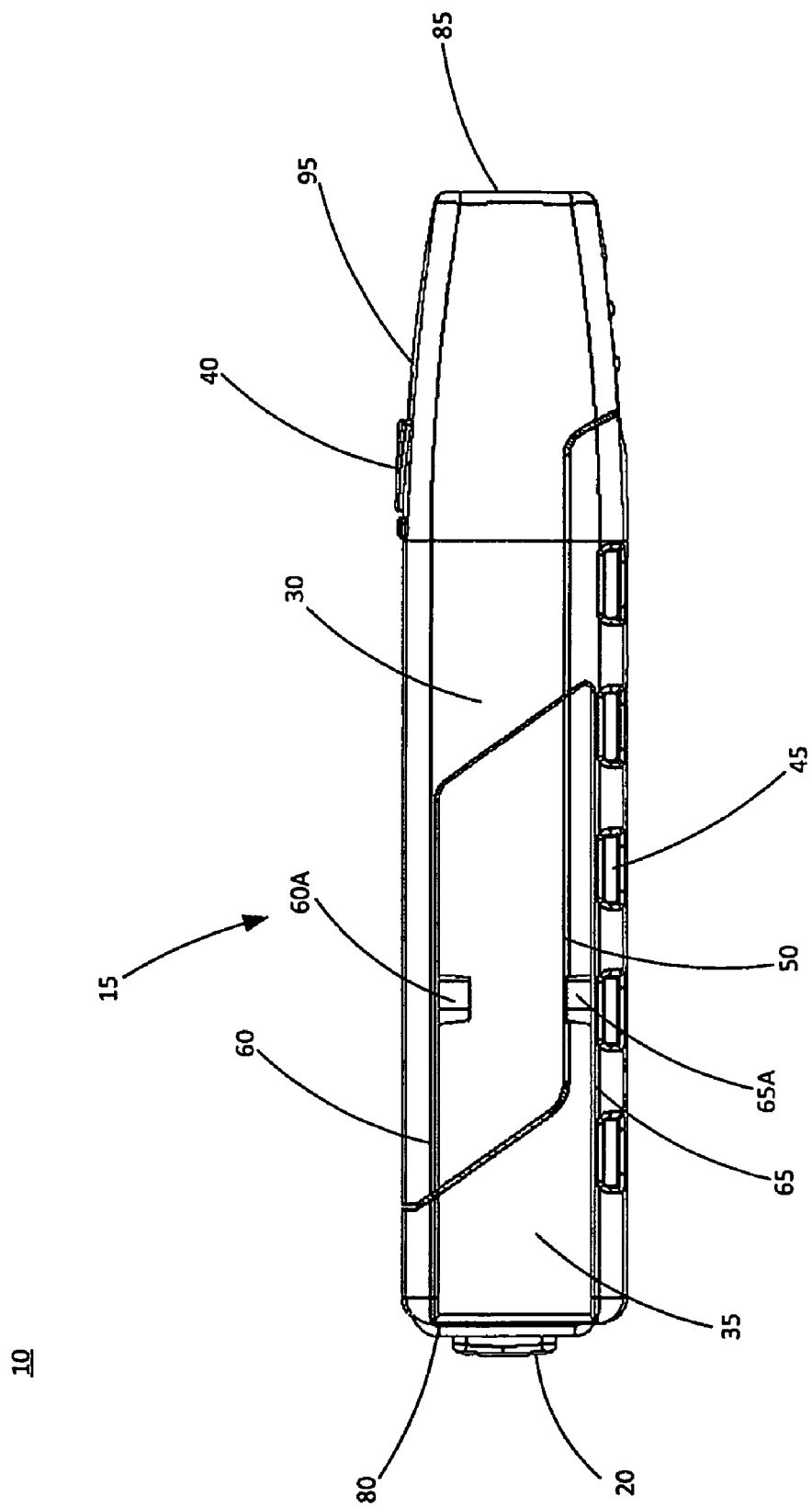

SLIDABLY ATTACHABLE NON-CONTACT VOLTAGE DETECTOR

RELATED APPLICATIONS

This application claims the benefit of prior filed U.S. provisional patent application Ser. No. 61/043,544, filed on Apr. 9, 2008, and Ser. No. 61/095,048, filed on Sep. 8, 2008, the entire contents of which are both hereby incorporated by reference.

BACKGROUND

This invention relates to a non-contact voltage detector ("NCVD"). NCVD's are electrical devices that are used to detect the presence of an AC voltage. NCVD's are often used in combination with, for example, hand tools (e.g., wire cutters, screwdrivers, etc.) or power tools (e.g., a drill). In some instances, the NCVD is embedded within the hand or power tool.

SUMMARY

Embodiments of the invention are related to a non-contact voltage detector ("NCVD") that is attachable to and detachable from a test and measurement device, such as a digital multimeter ("DMM") or an infrared ("IR") thermometer. The NCVD includes a first set of rails and a second set of rails that are each operable for slidable attachment to the test and measurement device. The NCVD also includes an LED flashlight, a voltage sensing circuit, a voltage sense indicator, and a switch for activating the LED flashlight and the voltage sensing circuit. In other embodiments of the invention, the NCVD is slidably attachable to a power tool such as a drill, a reciprocating saw, a circular saw, a screwdriver, an impact driver or wrench, a rotary hammer, a pipe cutter, a PVC cutter, and the like.

In one embodiment, the invention provides a non-contact voltage detector that is slidably attachable to a test and measurement device. The voltage detector includes a housing. The housing includes a voltage sense circuit located within the housing, a first set of rails, and a second set of rails. The housing also includes an upper portion having a voltage sense indicator and an LED flashlight, and a lower portion having a switch operable to activate the LED flashlight and the voltage sense circuit. The first set of rails and the second set of rails are each configured for slidable attachment to the test and measurement device, and the switch is positioned between the first set of rails and the second set of rails.

In another embodiment, the invention provides a non-contact voltage detector that is slidably attachable to a test and measurement device. The voltage detector includes a housing having a first set of rails and a second set of rails. The first set of rails and the second set of rails are each configured for slidable attachment to the test and measurement device. An upper portion of the housing includes a voltage sense indicator and an LED flashlight. A lower portion of the housing includes a switch operable to activate the LED flashlight. The upper portion of the housing is slidably attachable to the lower portion of the housing, and the switch and the LED flashlight are positioned opposite one another.

BRIEF DESCRIPTION OF THE DRAWINGS

FIG. 1 is a perspective view of a non-contact voltage detector ("NCVD") according to an embodiment of the invention.
FIG. 2 is a front view of the NCVD of FIG. 1.
FIG. 3 is a rear view of the NCVD of FIG. 1.
FIG. 4 is a left side view of the NCVD of FIG. 1.

DETAILED DESCRIPTION

Figure 5:
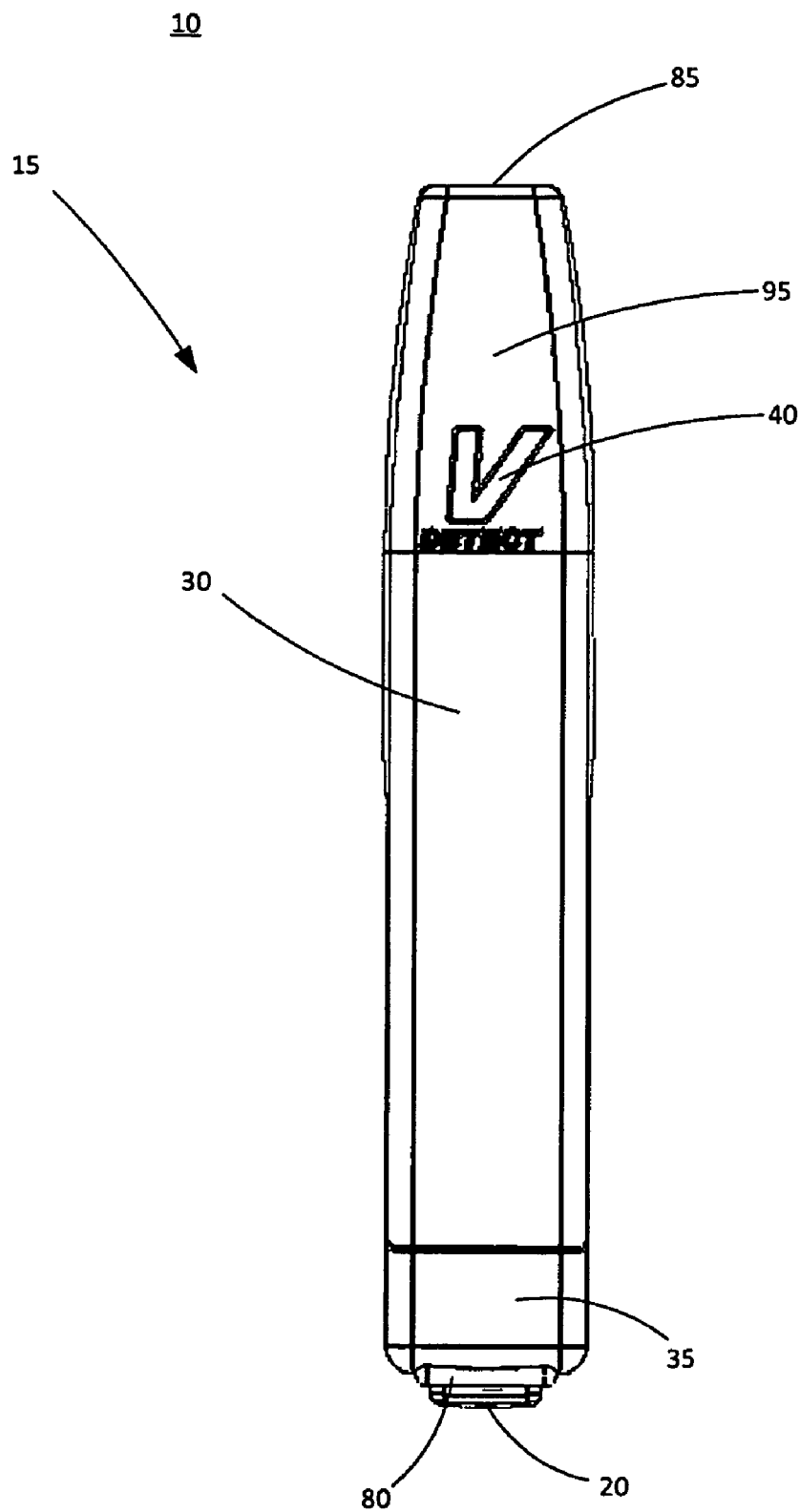
FIG. 5 is a top view of the NCVD of FIG. 1.
Figure 6:
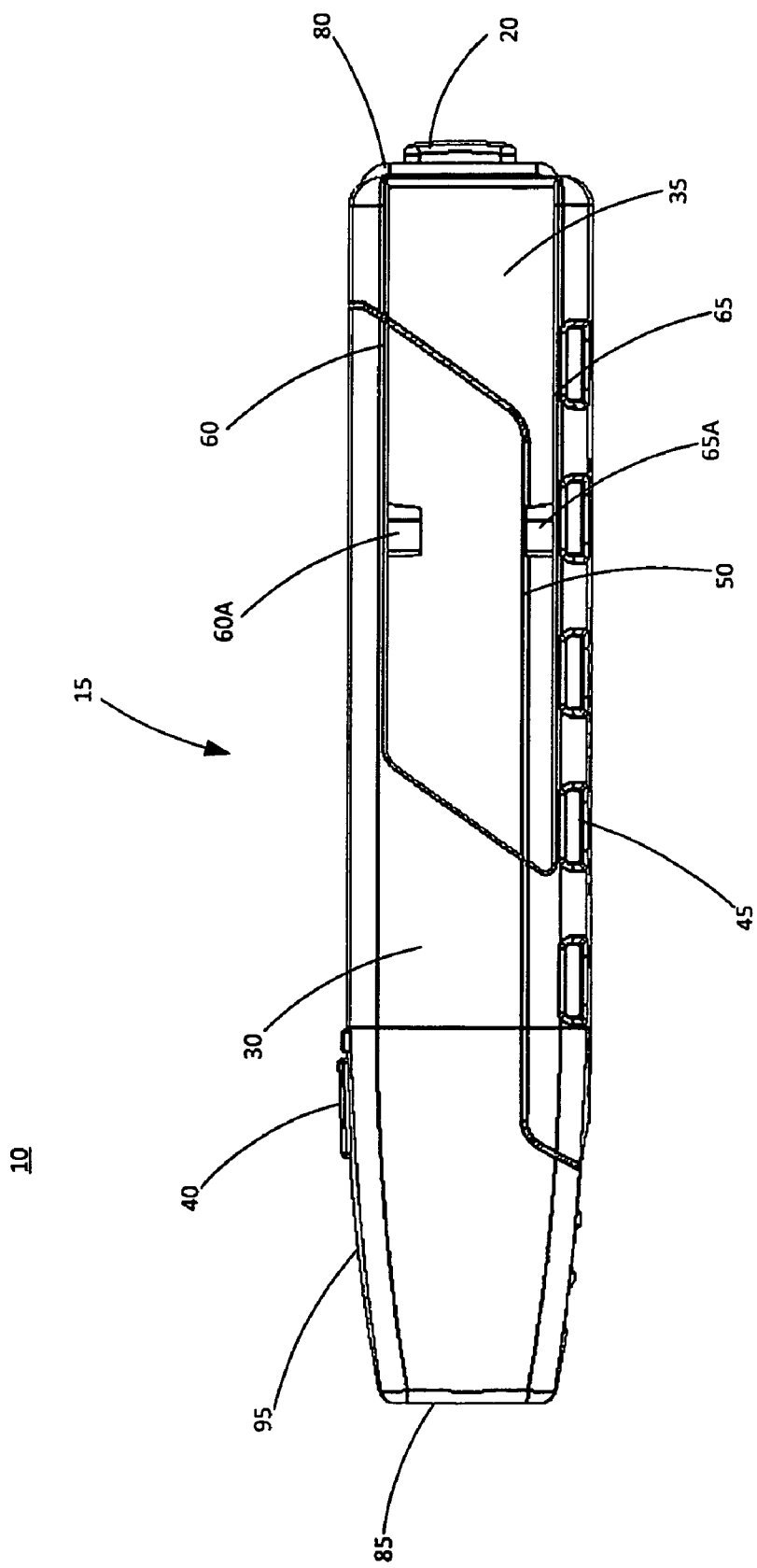
FIG. 6 is a right side view of the NCVD of FIG. 1.
Figure 7:
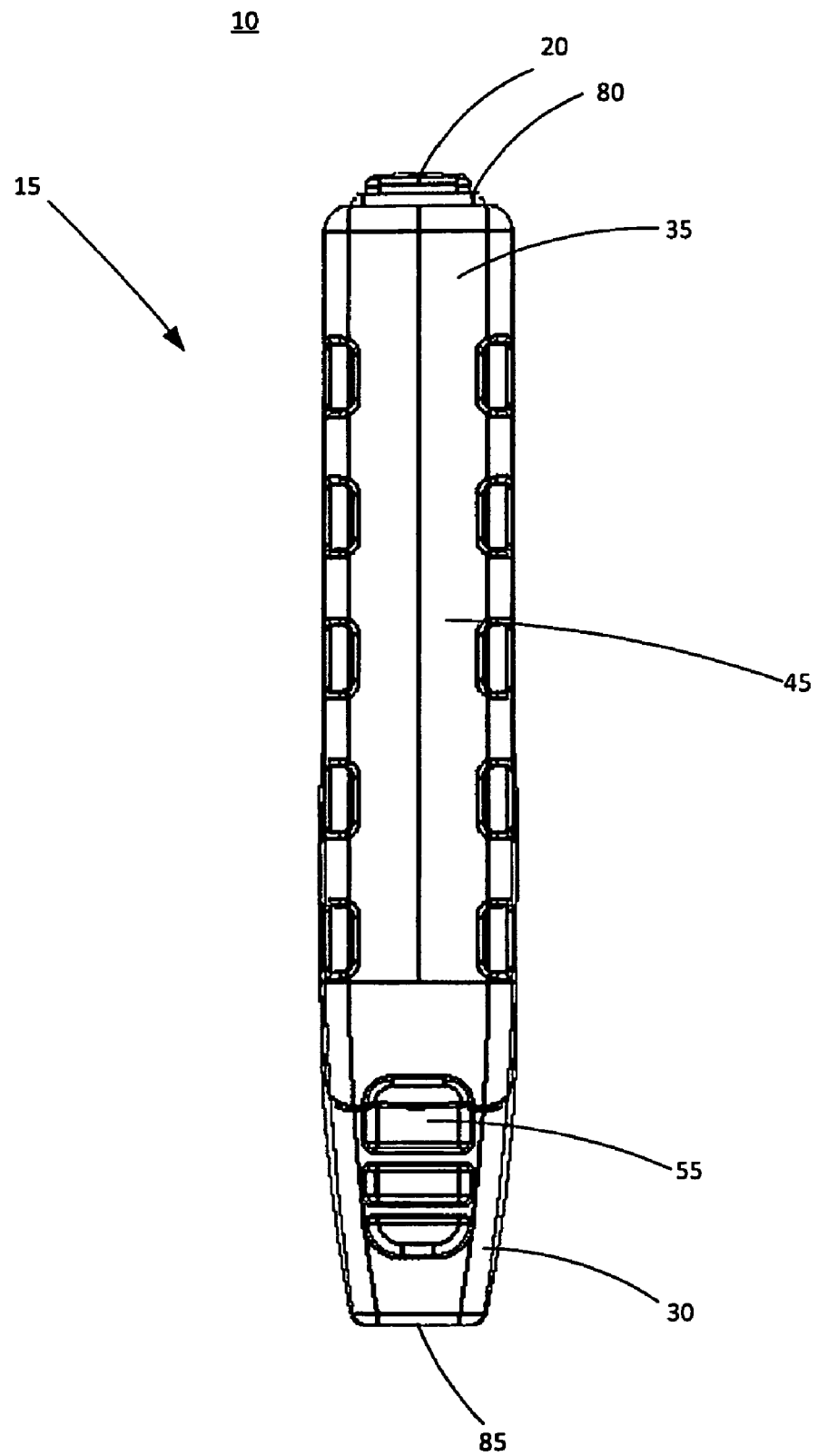
FIG. 7 is a bottom view of the NCVD of FIG. 1.
Figure 8:
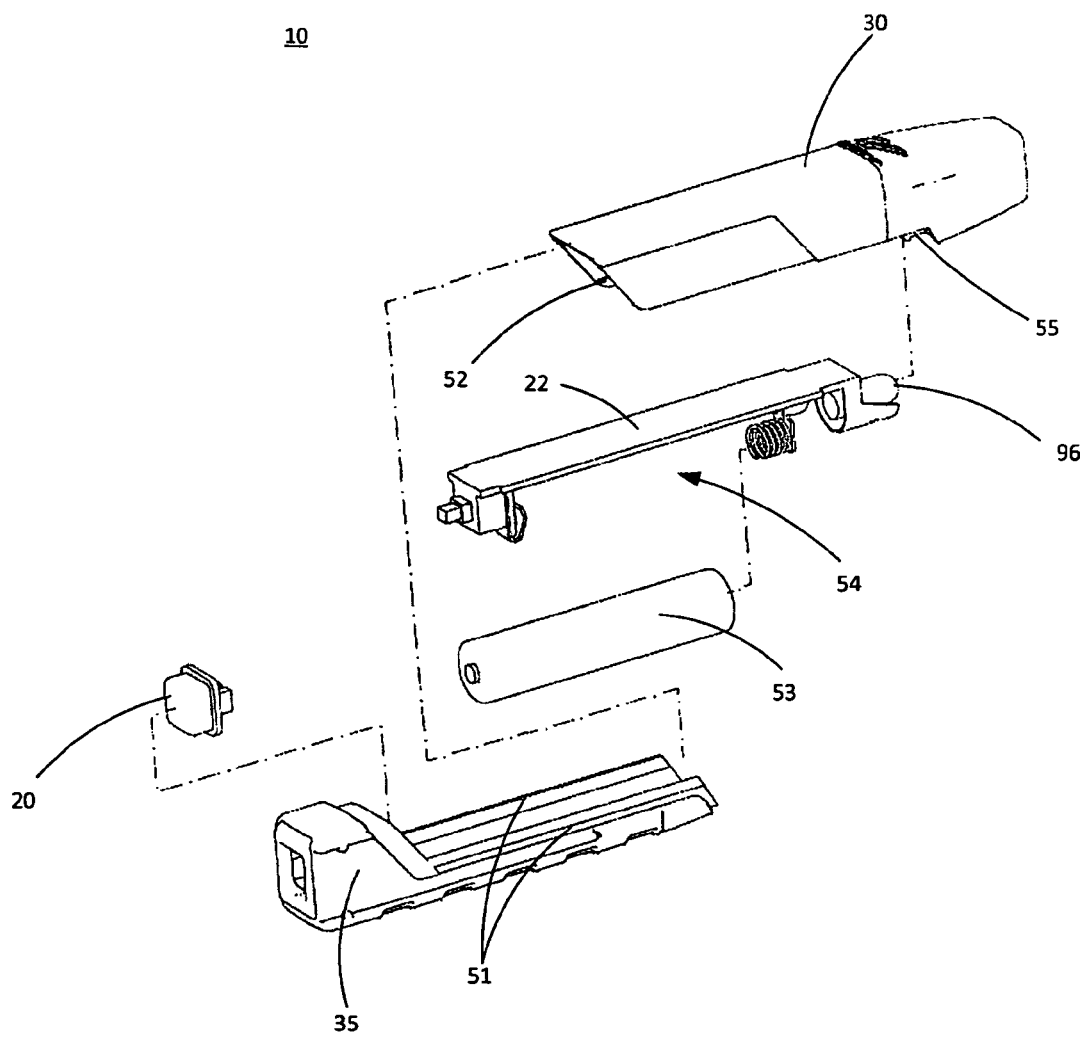
FIG. 8 is an exploded view of the NCVD of FIG. 1.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Embodiments herein describe a non-contact voltage detector ("NCVD") that includes a housing, a power switch, and an LED flashlight. The housing includes an upper portion and a lower portion which are slidably attachable to one another. A voltage sense circuit is positioned within the housing and illuminates a voltage sense indicator when it detects an AC voltage. The voltage sense circuit is operable to detect AC voltages in the range of, for example, 90V-600V. The power switch is operable to activate the voltage sense circuit and the LED flashlight. The NCVD includes a first set of rails and a second set of rails for slidably attaching the NCVD to a test and measurement device, such as a digital multimeter ("DMM") or an infrared ("IR") temperature gun. The NCVD is functional when attached to or detached from the test and measurement device.

FIGS. 1-8 illustrate an NCVD 10 according to an embodiment of the invention. The NCVD 10 includes a housing 15, a power switch 20, a voltage sense circuit 22 (shown as a printed circuit board in FIG. 8), and an LED flashlight 25 (see FIG. 2). The housing 15 includes an upper portion 30, a lower portion 35, a voltage sense indicator 40, and a grip portion 45. The upper portion 30 of the housing is slidably attachable to the lower portion 35 of the housing along a first attachment interface 50. For example, in one embodiment, the lower portion 35 includes a groove 51 and the upper portion 30 includes a rail 52 such that the rail 52 of the upper portion 30 slidably engages the groove 51 of the lower portion 35. A battery 53 can be inserted or removed from an interior chamber 54 of the NCVD 10 when the upper and lower portions 30 and 35 of the housing are detached from one another. In some embodiments, the housing 15 also includes a resilient tab 55 (see FIGS. 7 and 8) or latch for securing the upper portion 30 to the lower portion 35. The NCVD 10 is sized for use in areas that are not readily accessible by a larger object, such as a DMM or other test and measurement device.

A first set of rails 60 and a second set of rails 65 extend longitudinally along the housing 15. The first and second sets of rails 60 and 65 are formed by both the upper and lower portions of the housing 30 and 35. The first set of rails 60 forms a first plane 70 which defines a first mounting interface for the NCVD 10. The second set of rails 65 forms a second plane 75 which defines a second mounting interface for the NCVD 10. The first and second planes 70 and 75 are parallel to one another, and the first and second mounting interfaces are parallel to one another. The first and second sets of rails 60 and 65 are configured to mate with a corresponding set of rails or grooves on a test and measurement device, as described below. The first and second sets of rails 60 and 65 enable the NCVD 10 to be attached to multiple test and measurement devices such that the voltage sense indicator 40 is directed toward the line-of-sight of the user. The first and second sets of rails 60 and 65 include tabs 60A and 65A, respectively, which interface with an associated mounting structure of a test and measurement device to secure the NCVD 10 to the test and measurement device. In some embodiments, the NCVD 10 is attachable to the test and measurement devices in a different manner, such as magnetically, using a ball (bulb) connection, or the like. For example, the first and second sets of rails 60 and 65 can be snapped into a complementary receiving portion of the test and measurement device. The NCVD 10 is also configured to attach to the test and measurement device such that both the NCVD 10 and the test and measurement device can be used at the same time. In other embodiments, the first set of rails 60 and the second set of rails 65 are not included in (i.e., are separate from) the housing 15.

The power or on/off switch 20 is located on a rear surface 80 of the NCVD 10 between the first and second sets of rails 60 and 65 (i.e., between the first and second planes 70 and 75). The LED flashlight 25 is located on a front surface 85 of the NCVD 10, and is positioned directly opposite the power switch 20. The voltage sense indicator 40 is located on a top surface 95 of the NCVD 10 near the front surface 85 of the NCVD 10. In the illustrated embodiment, the voltage sense indicator 40 is V-shaped and includes an LED 96. In some embodiments, the voltage sense indicator 40 includes multiple LEDs or is configured to provide 360° illumination, such that the user is able to recognize whether a voltage is detected regardless of the orientation of the NCVD 10. In other embodiments, the NCVD 10 includes one or more longitudinal or horizontal light pipes such that the entire NCVD 10 or the edges of the NCVD 10 illuminate when a voltage is detected. In some embodiments, the NCVD 10 also includes a speaker (e.g., a piezoelectric speaker) for providing an audible indication to the user when a voltage is detected. For example, the NCVD 10 generates an audible signal at a first rate when the voltage is detected. Additionally or alternatively, the NCVD 10 produces audible signals at a rate which is proportional to the amplitude of a sensed voltage. Additional embodiments of the invention can provide the user with tactile feedback (e.g., a vibration) when a voltage is detected.

Figure 9:
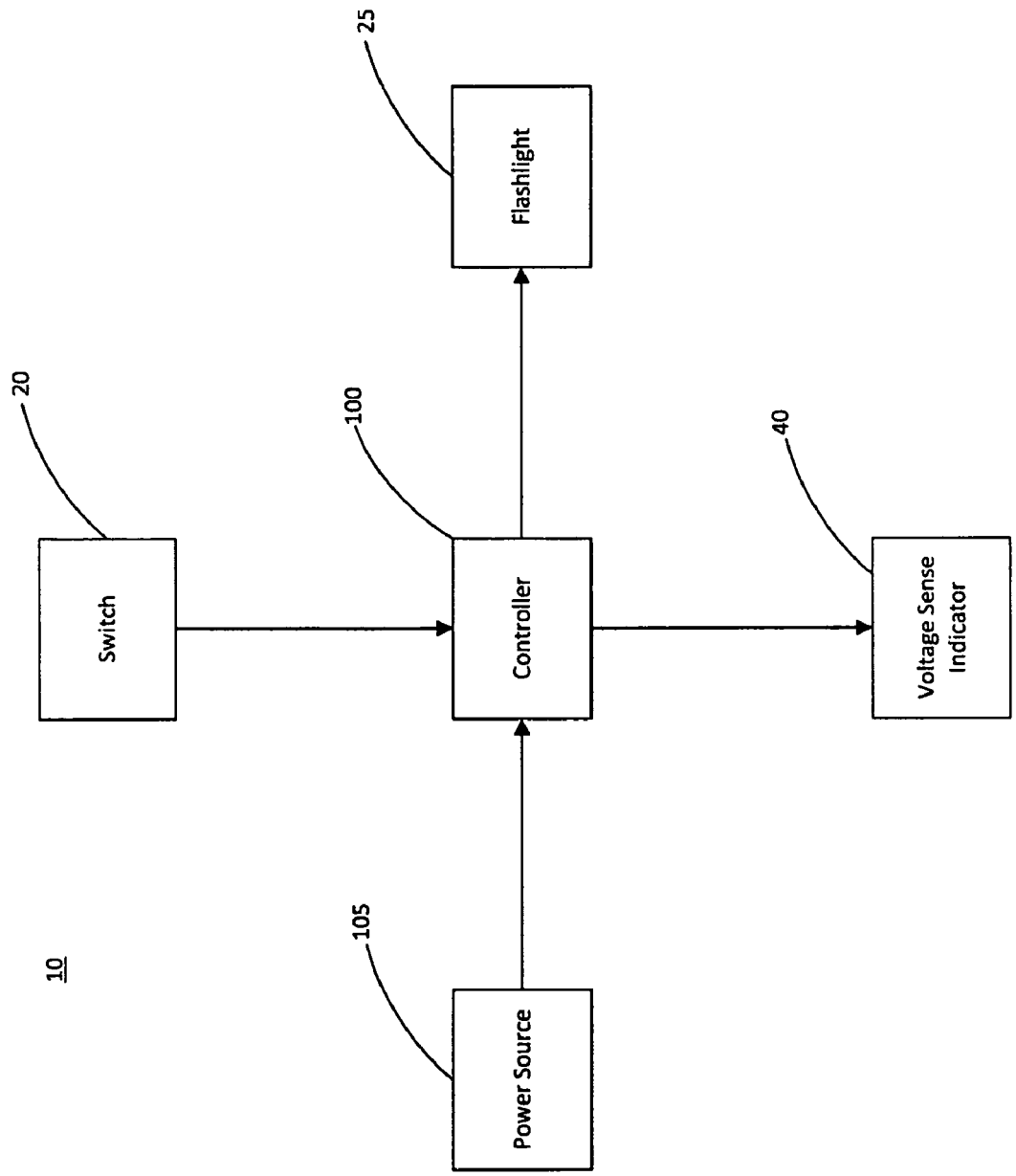
FIG. 9 is a block diagram of the NCVD of FIG. 1.

FIG. 9 is a block diagram of the NCVD 10. The NCVD 10 includes a controller 100, a power source 105, the switch 20, the flashlight 25, and the voltage sense indicator 40. The controller 100 includes, for example, a printed circuit board ("PCB") that is populated with a plurality of electrical and electronic components which provide operational control and protection to the NCVD 10. The PCB also includes, for example, a plurality of passive and active components such as resistors, capacitors, inductors, integrated circuits, and amplifiers. These components are arranged and connected to provide a plurality of electrical functions to the PCB including, among other things, sensing, filtering, signal conditioning, and voltage regulation. For descriptive purposes, the PCB and the electrical components populated on the PCB are collectively referred to herein as "the controller" 100. The controller 100 receives signals from an antenna which is electrically connected to the voltage sense circuit. The controller 100 performs any necessary conditioning or processing of the signals, and provides output signals to the voltage sense indicator 40. The controller 100 is operable to control the activation of the LED flashlight 25 and includes at least a portion of the voltage sense circuit.

The NCVD 10 is an active device. The power source 105 (e.g., a battery) is located within the housing 15. In one embodiment, the battery 105 is a single AAA alkaline battery. Power is selectively supplied to the NCVD 10 using the switch 20. For the NCVD 10 described above, the switch 20 is a pushbutton switch. The switch 20 is electrically connected to the controller 100 within the housing 15. In other embodiments, the NCVD 10 is passive, the power source 105 is always connected to the voltage detecting circuit, and a user does not need to activate the switch 20 before using the NCVD 10 to detect voltage.

When the switch 20 is actuated, the NCVD 10 is turned "on," and the LED flashlight 25 is illuminated such that the user is provided with a continuous visual indication of the operability of the NCVD 10. For example, if the battery within the NCVD 10 is depleted and the voltage sense circuit is not receiving power, the user is unable to detect the presence of a voltage. As a result of the LED flashlight 25 being illuminated when the voltage sense circuit is powered (i.e., the NCVD 10 is "on"), the user receives a continuous indication of the charge state of the battery (e.g., whether the battery is depleted). In one embodiment, the LED flashlight 25 is configured to flash continuously or a predetermined number of times when the voltage level of the battery is below a predetermined threshold value. In some embodiments, the NCVD 10 includes an LED switch that allows the user to deactivate the LED flashlight 25 while continuing to power the voltage sense circuit. In such embodiments, the voltage sense indicator 40 is configured to flash a predetermined number of times or remain illuminated for a predetermined period of time after the switch 20 is actuated to provide the user with an indication of the operability of the NCVD 10. In other embodiments, the LED flashlight 25 and the voltage sense indicator 40 are each configured to illuminate, flash, or any combination thereof when the switch 20 is actuated. In additional embodiments, the NCVD 10 can also include a test button. When the test button is actuated, the user is provided with a visual or audible indication that the battery is not depleted and that the voltage sense circuit is powered.

Figure 10:
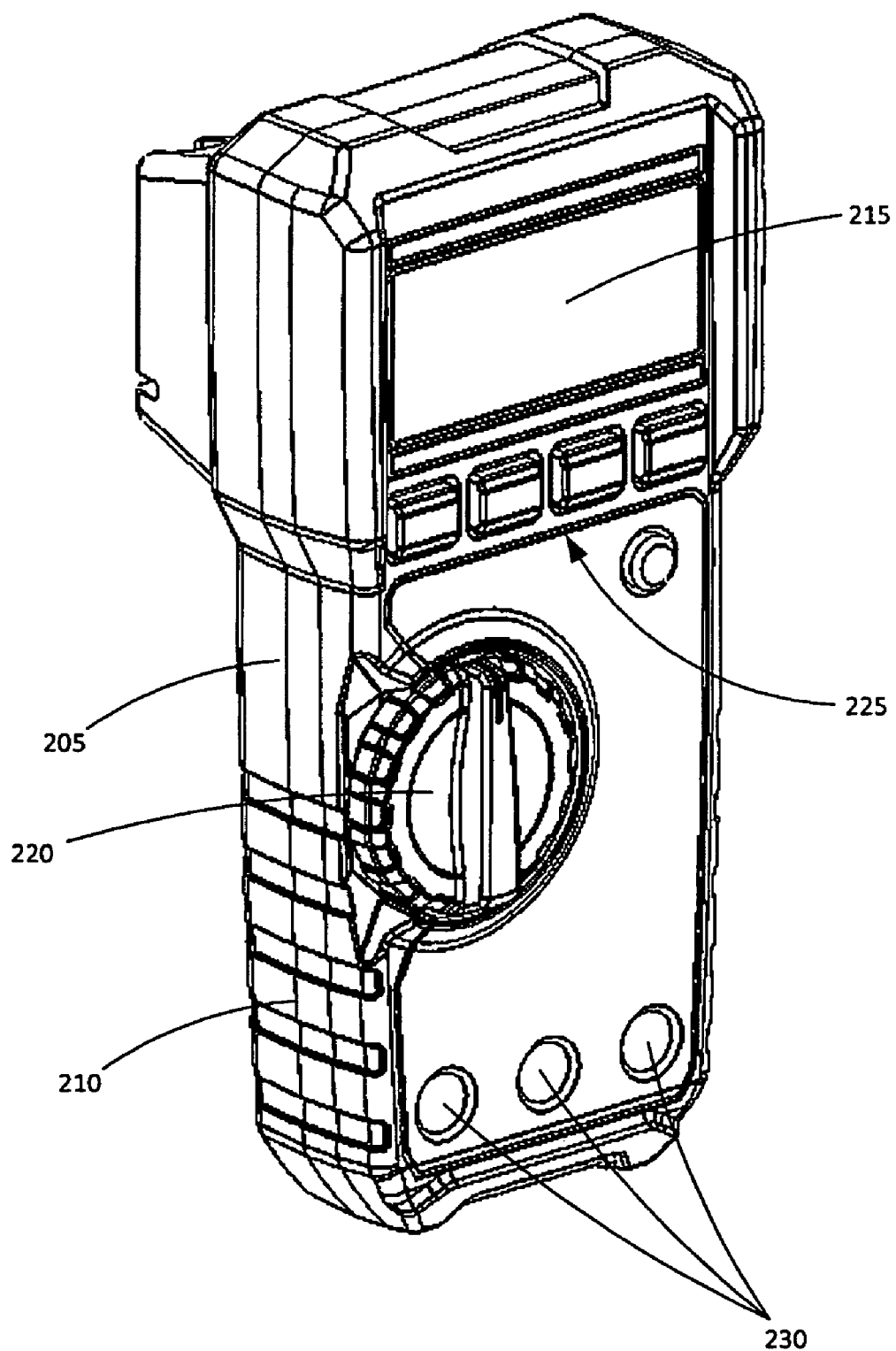
FIG. 10 is a perspective view of a digital multimeter ("DMM") configured for attachment of the NCVD of FIG. 1.
Figure 11:
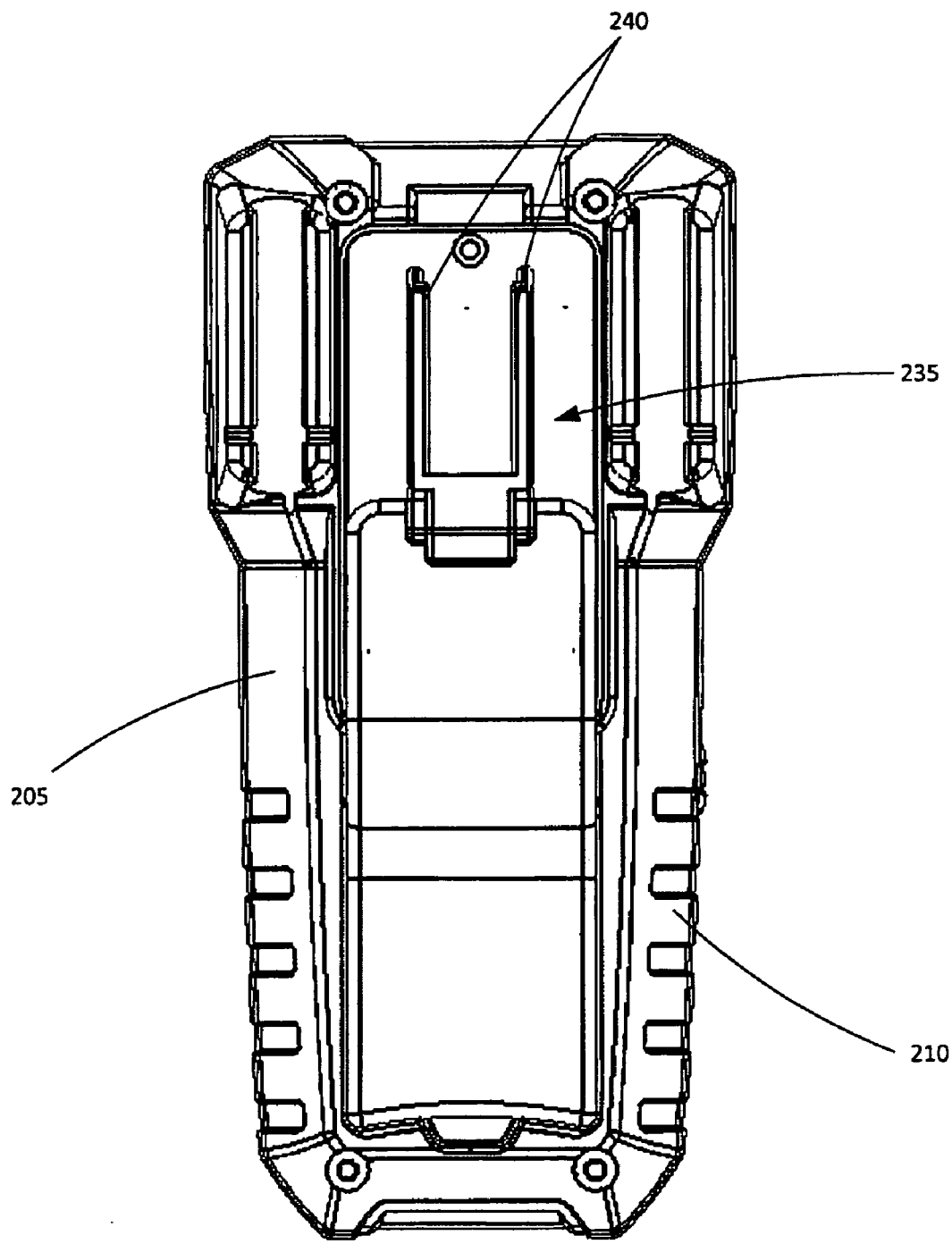
FIG. 11 is a rear view of the DMM of FIG. 10.
Figure 12:
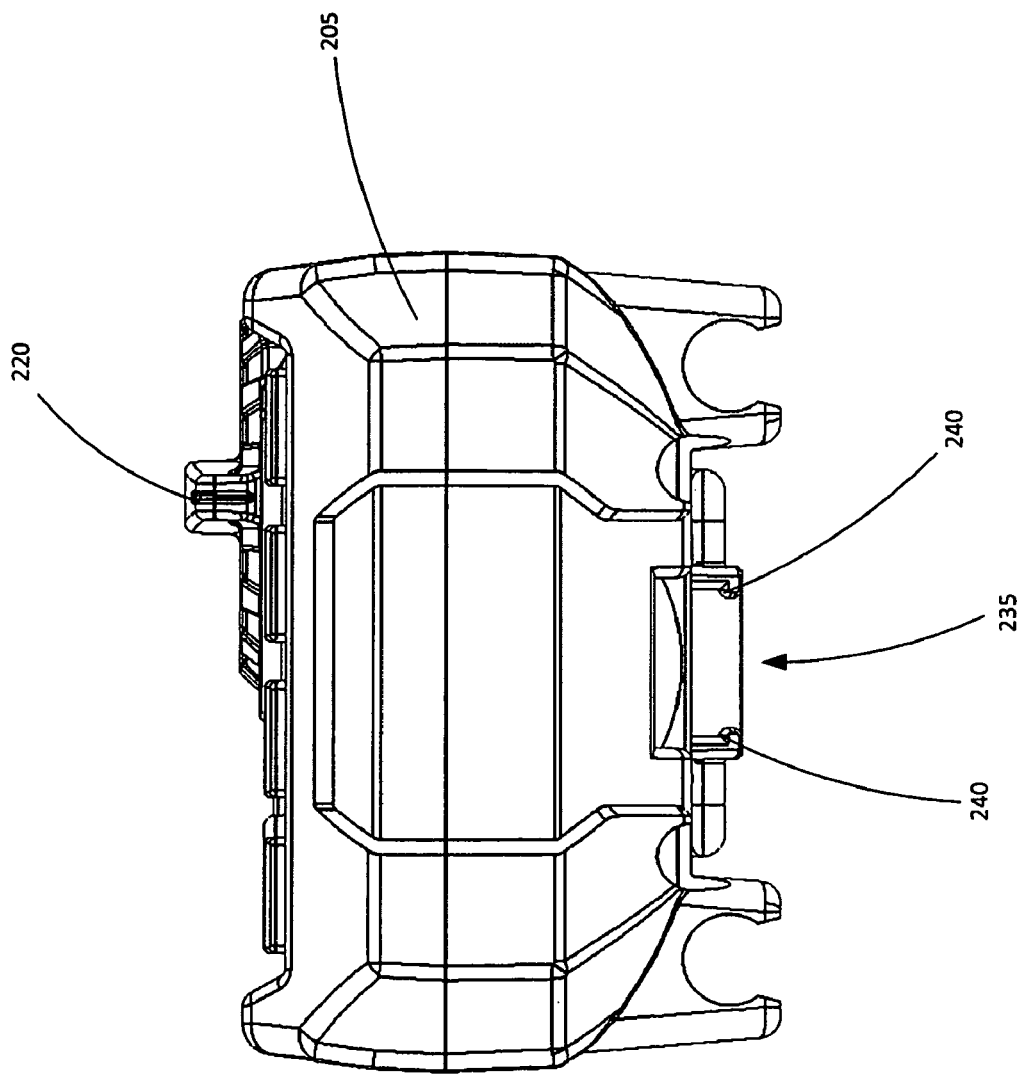
FIG. 12 is a top view of the DMM of FIG. 10.

FIGS. 10-12 illustrate an embodiment of a test and measurement device 200 that is configured to receive the NCVD 10. In the illustrated embodiment, the test and measurement device 200 is a DMM. The DMM 200 includes, among other things, a main housing 205, a power source (not shown), a grip portion 210, a display 215, a function selection knob 220, a plurality of functional buttons 225, and a plurality of electrical terminals 230. In some embodiments, the power source can include a plurality of alkaline-based batteries. The batteries are individually insertable and removable from the DMM 200. The batteries are held in place by springs and are positioned behind a removable cover. The alkaline-based batteries are, for example, AA batteries, AAA batteries, or the like. In other embodiments, the power source is a battery pack that is insertable into a recess of the DMM 200. The battery pack can be, for example, a six-volt ("6V") alkaline battery pack that includes a plurality of alkaline-based battery cells positioned within a battery casing. The battery cells are, for example, standard or rechargeable AA batteries, AAA batteries, or the like. In other embodiments, the battery pack is a twelve-volt ("12V") battery pack, and includes battery cells having, for example, a lithium ("Li"), lithium-ion ("Li-Ion"), or different lithium-based chemistry. The battery pack can have a nominal voltage of, for example, 3V, 6V, or 12V. In other embodiments, the battery pack includes cells of different chemistries and different nominal voltages. The battery pack is a rechargeable battery pack and is insertable along an axis extending through the grip portion 210 and into a cavity or recess formed in the main housing 205. In some embodiments, the battery casing conforms to a contour of the grip portion.

The function selection knob 220 is operable to select an operational mode of the DMM 200 (e.g., voltage measurement, current measurement, etc.). The functional buttons 225 are operable to provide additional functionality to the DMM 200. For example, the functional buttons 225 are operable to zero the DMM 200, change the units of a displayed value, temporarily hold or save a displayed value, and/or display minimum and maximum measured values.

As shown in FIGS. 11 and 12, the DMM 200 includes a mounting structure 235 for receiving the NCVD 10. In the illustrated embodiment, the DMM 200 includes a first set of rails 240 configured to mate with the rails 60 or 65 of the NCVD 10. In other embodiments, the DMM 200 includes a first set of grooves for receiving the rails of the NCVD 10. The mounting structure 235 receives either the first set of rails 60 or the second set of rails 65 of the NCVD 10. In one embodiment, the DMM 200 receives the first set of rails 60 of the NCVD 10 along the first mounting interface. As a result, the voltage sense indicator 40 is directed to the line-of-sight of the user (e.g., directly above the display 215). Accordingly, the user is able to identify whether a voltage is detected without having to reorient the DMM 200 or the NCVD 10. In other constructions, the mounting structure 235 is positioned at a different location on the DMM 200, such as a side or the bottom of the DMM 200. The NCVD 10 is functional when attached to or detached from the DMM 200.

Figure 13:
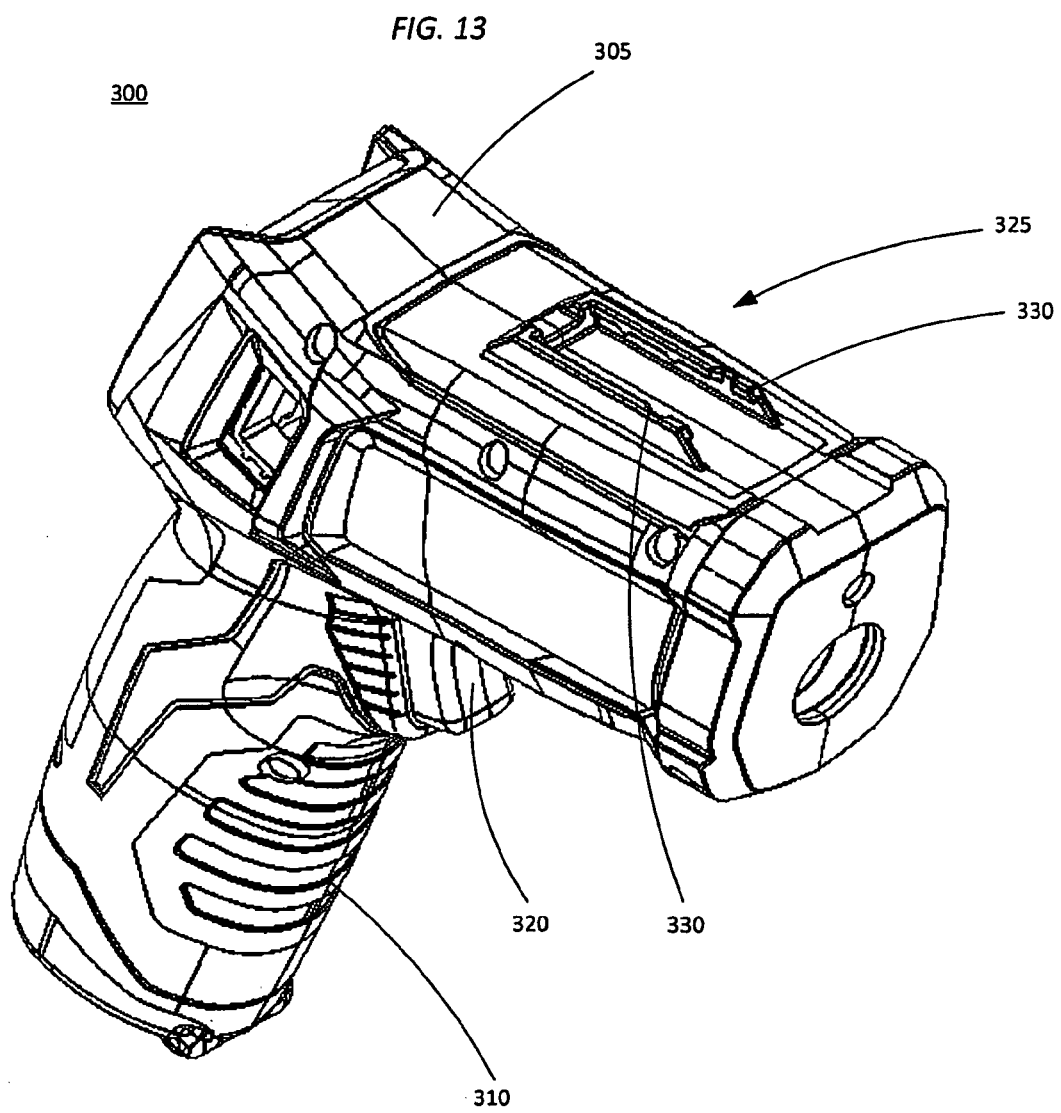
FIG. 13 is a perspective view of an infrared ("IR") thermometer configured for attachment of the NCVD of FIG. 1.
Figure 14:
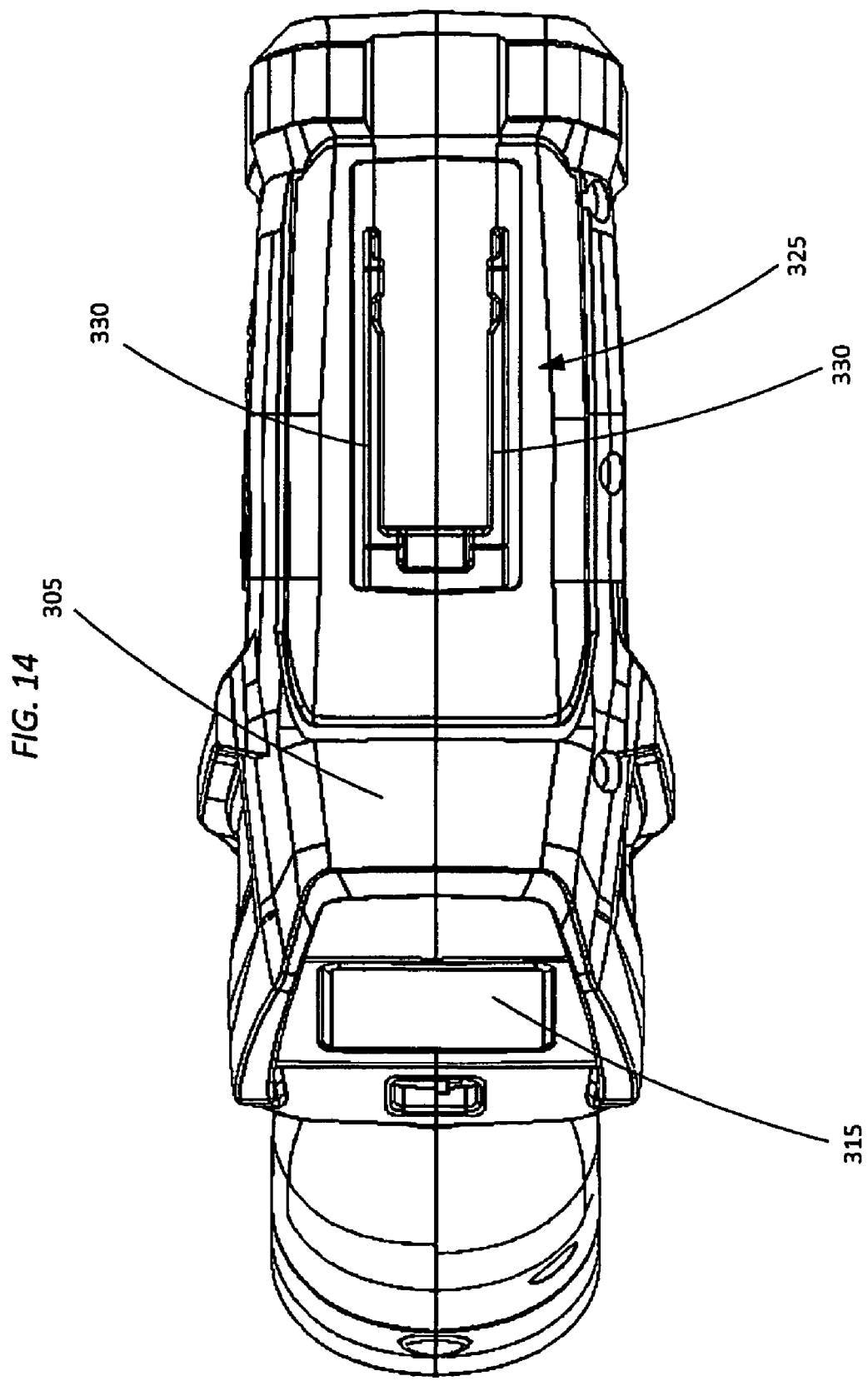
FIG. 14 is a top view of the IR thermometer of FIG. 13.
Figure 15:
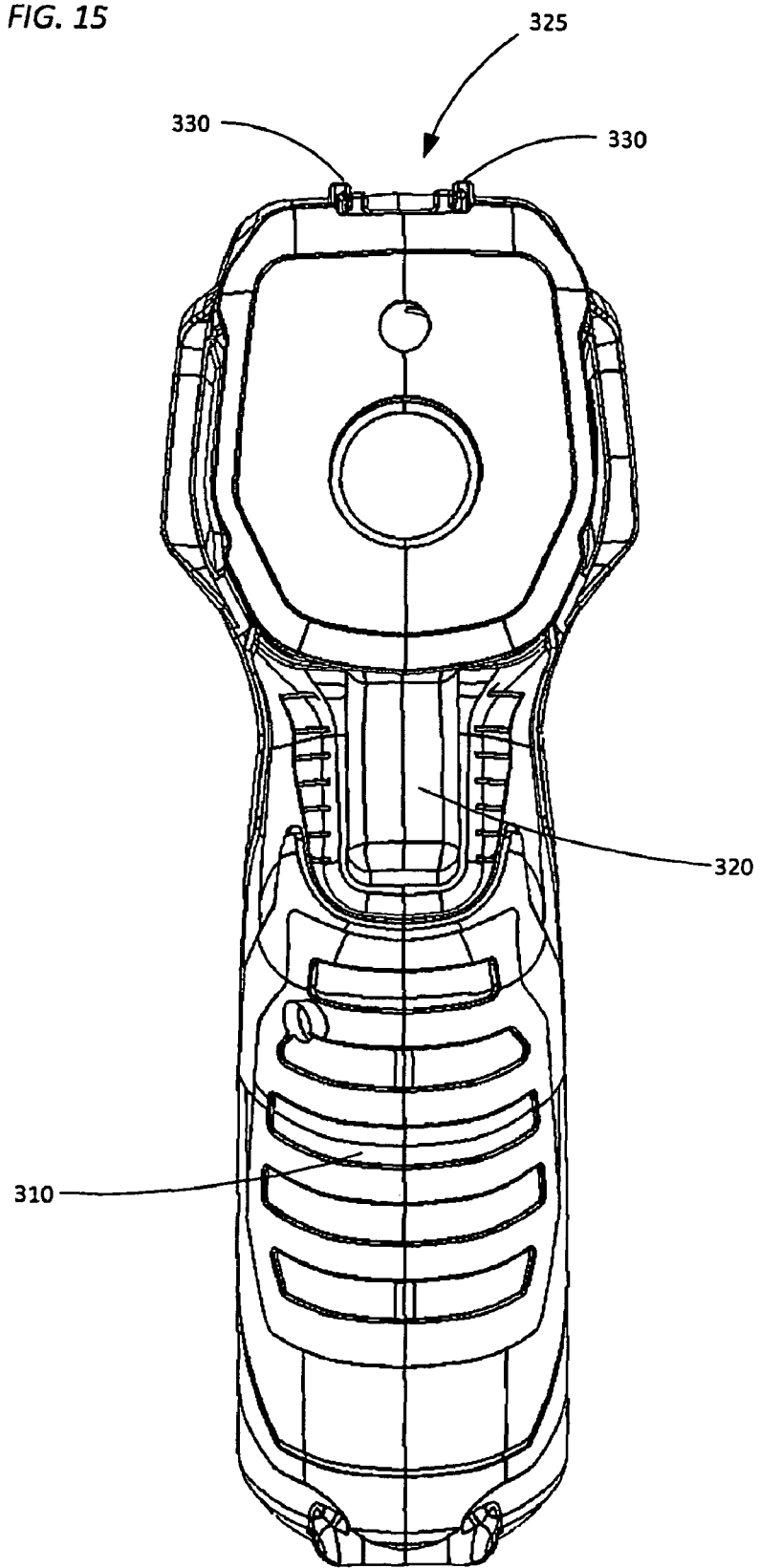
FIG. 15 is a front view of the IR thermometer of FIG. 13.

FIGS. 13-15 illustrate another embodiment of a test and measurement device 300 that is configured to receive the NCVD 10. In the illustrated embodiment, the test and measurement device 300 is an IR thermometer. The thermometer 300 includes, among other things, a main housing 305, a power source (not shown), a grip portion 310, a display 315, a trigger 320, and a laser (not shown). In the illustrated embodiment, the power source includes a plurality of alkaline-based batteries. The batteries are individually insertable and removable from the thermometer 300. The batteries are held in place by springs and are positioned behind a removable cover. The alkaline-based batteries are, for example, AA batteries, AAA batteries, or the like. In other embodiments, the power source is a battery pack that is insertable into a recess of the thermometer 300. The battery pack can be, for example, a six-volt ("6V") alkaline battery pack that includes a plurality of alkaline-based battery cells positioned within a battery casing. The battery cells are, for example, standard or rechargeable AA batteries, AAA batteries, or the like. In other embodiments, the battery pack is a twelve-volt ("12V") battery pack, and includes battery cells having, for example, a lithium ("Li"), lithium-ion ("Li-Ion"), or different lithium-based chemistry. The battery pack can have a nominal voltage of, for example, 3V, 6V, or 12V. In other embodiments, the battery pack includes cells of different chemistries and different nominal voltages. The battery pack is a rechargeable battery pack and is insertable along an axis extending through the grip portion 310 and into a cavity or recess formed in the main housing 305. In some embodiments, the battery casing conforms to a contour of the grip portion 310. The trigger 320 is operable to be depressed by the user to take a non-contact temperature measurement of an area, and the laser provides an indication to the user of the area for which the non-contact temperature measurement is taken.

The thermometer 300 includes a mounting structure 325 for receiving the NCVD 10. In the illustrated embodiment, the thermometer 300 includes a first set of rails 330 configured to mate with the rails of the NCVD 10. In other embodiments, the thermometer 300 includes a first set of grooves for receiving the rails of the NCVD 10. The mounting structure 325 is operable to receive either the first set of rails or the second set of rails 60 and 65 of the NCVD 10. In one embodiment, the thermometer 300 receives the second set of rails 65 of the NCVD 10 along the second mounting interface. As a result, the voltage sense indicator 40 is directed to the line-of-sight of the user (e.g., on a top surface of the main housing 305). Accordingly, the user is able to identify whether a voltage is detected without having to reorient the thermometer 300 or the NCVD 10. In other constructions, the mounting structure 325 is positioned at a different location on the thermometer 300, such as a side or the handle of the thermometer 300. The NCVD 10 is functional when attached to or detached from the thermometer 300.

In some embodiments of the invention, the NCVD 10 is configured to receive power from the test and measurement device's power source when connected with the device. For example, the NCVD 10 includes at least one terminal for electrically connecting to and receiving power from the test and measurement device. In some embodiments, the battery located within the NCVD 10 is charged or otherwise receives power from the device's power supply. Additionally or alternatively, the NCVD 10 includes a communications link with the device. In some embodiments, information related to, among other things, battery life remaining, magnitudes of detected voltages, and duration of time detached from the tool are stored in a memory located in the controller of the NCVD 10 and are communicated to the device when the NCVD 10 is attached to the device. In other embodiments, the NCVD 10 and the device communicate wirelessly using a local area network protocol such as ZigBee, Bluetooth, or the like.

Although the invention is described above with respect to a DMM and an IR thermometer, additional embodiments of the invention provide an NCVD 10 that is slidably attachable to additional test and measurement devices such as a clamp meter, a fork meter, a wall scanner, and the like. In other embodiments, the NCVD is slidably attachable to a mounting structure included on a power tool (e.g., a drill, a reciprocating saw, a circular saw, a screwdriver, an impact driver or wrench, a rotary hammer, a pipe cutter, a PVC cutter, and the like). The mounting structure is substantially similar to the mounting structures 235 and 325 described above.

Thus, the invention provides, among other things, a NCVD that includes a housing, a power switch, and an LED flashlight. A voltage sense circuit is positioned within the housing and illuminates a voltage sense indicator when an AC voltage is detected. The power switch is operable to activate the voltage sense circuit and the LED flashlight. The NCVD includes a first set of rails and a second set of rails for slidably attaching the NCVD to a test and measurement device such as a digital multimeter ("DMM") or an infrared ("IR") temperature gun. Various features and advantages of the invention are set forth in the following claims.

What is claimed is:

1. A non-contact voltage detector slidably attachable to a test and measurement device, the voltage detector comprising:
   a housing;
   a first set of rails forming a first plane and defining a first mounting interface for attachment to the test and measurement device;

a second set of rails forming a second plane and defining a second mounting interface for attachment to the test and measurement device, the first plane and the second plane being approximately parallel to one another;

a voltage sense circuit located within the housing;

a voltage sense indicator and an LED flashlight located within an upper portion of the housing; and a lower portion of the housing including a switch operable to activate the LED flashlight and the voltage sense circuit, the voltage sense indicator being illuminated independently of the LED flashlight when the voltage sense circuit senses a voltage, wherein the first set of rails and the second set of rails are each configured for slidably attachment to the test and measurement device, and wherein the switch is positioned between the first set of rails and the second set of rails.

2. The voltage detector of claim 1, wherein the LED flashlight is located at a first end of the housing and the switch is located at a second end of the housing.

3. The voltage detector of claim 2, wherein the voltage sense indicator is located between the switch and the LED flashlight.

4. The voltage detector of claim 3, wherein the LED flashlight provides an indication of a charge state of a battery within the voltage detector.

5. The voltage detector of claim 1, further comprising a grip portion.

6. The voltage detector of claim 1, wherein the upper portion of the housing is slidably attachable to the lower portion of the housing.

7. The voltage detector of claim 1, wherein the voltage detector is an active device.

8. The voltage detector of claim 1, wherein the first mounting interface is parallel to the second mounting interface.

9. The voltage detector of claim 1, wherein the housing includes the first and second sets of rails.

10. A non-contact voltage detector slidably attachable to a test and measurement device, the voltage detector comprising:

a housing;

a first set of rails and a second set of rails, a first set of rails forming a first plane and defining a first mounting interface for attachment to the test and measurement device;

a second set of rails forming a second plane and defining a second mounting interface for attachment to the test and measurement device, the first plane and the second plane being approximately parallel to one another, wherein the first set of rails and the second set of rails are each configured for slidably attachment to the test and measurement device;

a voltage sense indicator and an LED flashlight located within an upper portion of the housing, the voltage sense indicator being illuminated independently of the LED flashlight when the voltage detector detects a voltage; and a switch located within a lower portion of the housing and operable to activate the LED flashlight, wherein the upper portion of the housing is slidably attachable to the lower portion of the housing, and wherein the switch and the LED flashlight are positioned opposite one another.

11. The voltage detector of claim 10, wherein the LED flashlight is located at a first end of the housing and the switch is located at a second end of the housing.

12. The voltage detector of claim 11, wherein the voltage sense indicator is located between the switch and the LED flashlight.

13. The voltage detector of claim 12, wherein the LED flashlight provides an indication of a charge state of a battery within the voltage detector.

14. The voltage detector of claim 10, further comprising a grip portion.

15. The voltage detector of claim 10, wherein the first mounting interface is parallel to the second mounting interface.

16. The voltage detector of claim 10, wherein the housing includes the first and second sets of rails.

* * * * *